United States Patent

Ueno

[11] 4,061,990
[45] Dec. 6, 1977

[54] FREQUENCY COMBINING CIRCUIT
[75] Inventor: Tomoki Ueno, Hirakata, Japan
[73] Assignee: Matsushita Electric Industrial Co., Ltd., Kadoma, Japan
[21] Appl. No.: 735,416
[22] Filed: Oct. 26, 1976
[30] Foreign Application Priority Data
Oct. 27, 1975 Japan .................. 50-129482
[51] Int. Cl.² ............................................ H01P 5/18
[52] U.S. Cl. ..................................... 333/10; 330/4.9; 325/445
[58] Field of Search ............. 330/4.5, 4.9; 325/445, 325/446; 333/10

[56] References Cited
U.S. PATENT DOCUMENTS
3,218,564  11/1965  Seidel ........................... 330/4.9 X
3,437,935  4/1969  Webb ............................. 325/446
3,453,638  7/1969  Hoovler ......................... 333/10 X Primary Examiner—Paul L. Gensler
Attorney, Agent, or Firm—Wenderoth, Lind & Ponack

[57] ABSTRACT

A frequency combining circuit in the form of a planar transmission circuit has a four-port directional coupler, two transmission lines respectively coupled to the forward and backward coupling ports of the directional coupler, and two filters respectively coupled to the two transmission lines, one of the two filters being further coupled to a load. By applying a first frequency signal to the coupler input port and applying a second frequency signal to the other one of the filters, the first and second frequency signals are combined in an excellent manner at the coupler output port of the coupler due to the provision of the two filters both of which reject the first frequency signal and pass therethrough the second frequency signal.

5 Claims, 8 Drawing Figures

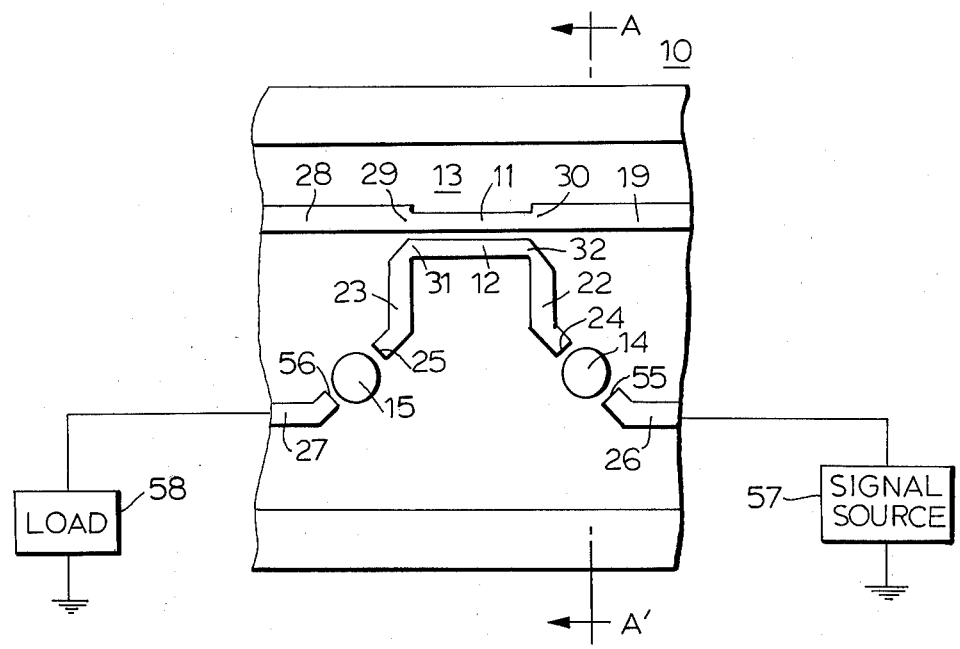
FIG I
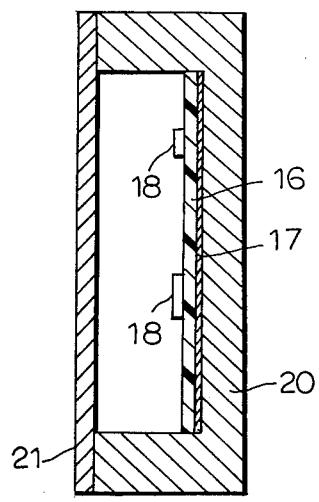
FIG IA

FREQUENCY COMBINING CIRCUIT

This invention relates to a frequency combining circuit in the form of a planar transmission circuit (microstrip or stripline) which can be used for a frequency conversion circuit.

It is known that a filter combining circuit can be made in the form of a planar transmission circuit which has a conductive ground layer provided on the rear surface of a substrate and a conductive pattern on the front surface of the substrate. An input signal is applied to an input port of the transmission circuit, the input port being constituted by the conductive ground layer and an input point on the conductive pattern and the input signal being applied across the conductive ground layer and the input point on the conductive pattern. Similarly, an output signal is taken out of an output port of the transmission circuit.

It is known that 3dB hybrid-rings can be employed as frequency combining circuits for frequency converters in hybrid integrated microwave circuits and by which an RF signal and a pump signal are combined. However, a frequency converter using a 3dB hybrid-ring, commonly called balanced-mixer, needs two mixing diodes connected to the respective power dividing ports of the 3dB hybrid-ring. The two mixing diodes are required to have the same characteristics, and in this type of the frequency converter, it is not easy to add thereto an image-rejection filter which minimizes the conversion loss. Furthermore, in a high frequency region such as above $10GH_Z$, the dividing loss becomes very large and isolation between the RF signal port and the pump signal port degrades because of the discontinuities of the branch lines.

Another way to combine two frequencies is to use a four-port directional coupler, and in this case only one mixing diode is needed when it is used for a frequency converter. However, the directional coupler unavoidably suffers a transmission loss due to energy splitting to the coupling ports.

It is an object of this invention to provide a frequency combining circuit in the form of a planar transmission circuit using a four-port directional coupler which can be used for a frequency converter using a single mixing diode and in which the dividing loss in the high frequency region and the transmission loss are small.

This object is achieved according to this invention by providing a frequency combining circuit in the form of a planar transmission circuit and operative in a selected frequency band, the frequency combining circuit comprising:

a four-port directional coupler having a coupler input port for receiving a first frequency signal in a first frequency band, a coupler output port coupled through a first coupler branch line to the coupler input port for receiving the first frequency signal from the coupler input port through the first coupler branch line, a coupler forward coupling port coupled to the first coupler branch line for receiving a portion of the first frequency signal, and a coupler backward coupling port coupled to the coupler forward coupling port through a second coupler branch line and also coupled to the first branch line;

a first transmission line coupled at one end thereof to the coupler backward coupling port;

first filter means coupled to the other end of the first transmission line and receiving a second frequency signal from a signal source, the second frequency signal being in a second frequency band separated from the first frequency band, the first filter means having a filtering property which rejects the first frequency signal and passes therethrough the second frequency signal to the first transmission line and hence to the coupler backward coupling port, whereby a portion of the second frequency signal is transferred to the coupler output port, and the other portion of the second frequency signal is transferred to the coupler forward coupling port through the second coupler branch line;

a second transmission line coupled at an end thereof to the coupler forward coupling port for passing therethrough to the other end thereof the portion of the first frequency signal from the coupler forward coupling port; and second filter means coupled to the other end of the second transmission line and having a filtering property which rejects the first frequency signal and passes therethrough the second frequency signal, the second filter means also being coupled to a load, whereby the portion of the first frequency signal passed through the coupler forward coupling port and the second transmission line is rejected by the second filter means and is returned to the coupler forward coupling port through the second transmission line, and the other portion of the second frequency signal passed through the second coupler branch line, the coupler forward coupling port and the second transmission line is passed through the second filter means to be absorbed by the load, and the pass band of the frequency combining circuit for the first frequency signal can be varied by varying the length of the first transmission line and the length of the second transmission line.

More specifically, in accordance with this invention, the two filter means are respectively coupled to two coupling ports of the four-port directional coupler, i.e., coupler forward and coupler backward coupling ports. This directional coupler is a prototype, that is, it has no power absorbing terminal or dummy element and thus consumes no power. The other ports of the directional coupler are an input port and an output port. The first frequency signal is applied to the coupler input port. The second frequency signal is applied to the filter means which is coupled to the backward coupling port of the coupler. Both of the two filter means reject the first frequency signal and pass the second frequency signal. The filter means connected to the forward coupling port is loaded by a matched load, and so the second frequency signal passed through this filter means is absorbed by this termination or load. A portion of the energy of the second frequency signal is coupled to the coupler output port when the second frequency signal passes from the coupler backward coupling port to the coupler forward coupling port, because the directional coupler operates reciprocally. Thus, the first frequency signal and a portion of the second frequency signal are combined at the coupler output port. And by varying the length of the transmission line between the coupler forward coupling port and one of the filter means and the length of the transmission line between the coupler backward coupling port and the other of the filter means, the pass band of the transmission for the first frequency signal from the input port to the output port can be varied. Thereby, the operable frequency band can be selected.

When the frequency combining circuit of this invention is used for frequency conversion, an RF signal is used for the first frequency signal, and a pump signal is used for the second frequency signal, and a mixing diode is connected to the coupler output port (combining-port) if the frequency conversion is a down-conversion. In the pass band, the loss of the RF signal is very small, because the split portion of the RF signal which is split in the coupler is completely reflected by the filter means back to the output port. When the directional coupler is a parallel coupled microstrip pair, a stop band for the RF signal can also be produced by adjusting the lengths of the transmission lines. By adjusting the stop band thereof so that it is at an image frequency and the pass band so that it is at an RF frequency by adjusting the lengths of the transmission lines, the frequency combining circuit of this invention can also operate as an image rejection filter.

Most of the pump signal is absorbed by the matched load coupled to one of the filter means, and therefore the influence, e.g., from the coupler input port (RF signal input port) and the mixing diode to the pump signal source is very small and thus the pump source can operate stably. This feature is important because thereby an appropriate power such as 20 to 100 mW which is easily obtained by using Gunn or Impatt diodes can be used for the pump source, and the coupling factor of the directional coupler can be selected so as to be comparatively large such as 10dB. The comparatively large coupling decreases the influence of the circuit elements, coupled to the coupling ports, on the RF signal. This in turn permits a large tolerance in the circuit pattern dimensions, so that the circuits can be fabricated easily.

Further, the provision of the two filter means contributes to the suppression of spurious signal components included in the pump signal. The unloaded Q of the resonance of the filter means need not be high, because even if it is low, the loss at the filter means due to the low unloaded Q can be compensated by increasing the power of the pump source.

The above described and other objects and features of this invention will more readily be understood upon considering the following detailed description taken together with the accompanying drawings, in which:

FIG. 1 is a schematic top plan view of an example of a frequency combining circuit in accordance with this invention;

FIG. 1A is a schematic cross-sectional view of the frequency combining circuit of FIG. 1 taken on the line A-A' of FIG. 1, and additionally showing a shielding cover which can be used in conjunction with the frequency combining circuit;

Figure 2:
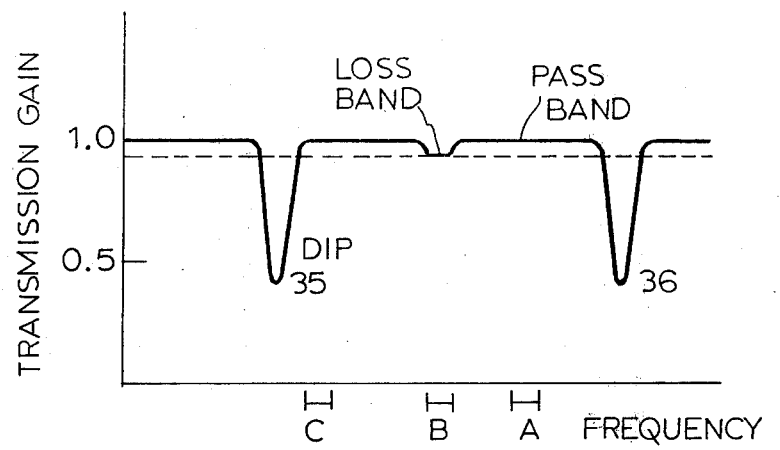
FIG. 2 is a graph showing transmission gain vs. frequency characteristics of the frequency combining circuit of FIG. 1.

Referring to FIG. 1 and FIG. 1A, reference numeral 10 designates a frequency combining circuit in the form of a planar transmission circuit, the conductor pattern of which includes a first coupler branch line 11 (between the points 29 and 30) and a second coupler branch line 12 (between the points 31 and 32) of a parallel coupled microstrip four-port directional coupler 13, and disk resonators 14 and 15 as first filter means and second filter means, respectively. These figures show a microstrip type of planar transmission line having a dielectric substrate 16 having a conductive ground layer 17 provided on the bottom surface thereof and a conductor pattern 18 deposited on the front surface thereof parallel to the ground layer 17. The conductor pattern can be deposited on the substrate 16 by conventional evaporation techniques or by screen printing. In the cross-section of the combining circuit shown, this conductor pattern 18 consists of the resonator 14 and transmission line 19 connected to the coupler branch line 11. Other elements shown in FIG. 1 are also included in the conductor pattern.

The microstrip line can be enclosed in a conductive shield conveniently formed by two separable portions. The first portion forms a channel 20, on an internal surface of which the ground layer 17 is provided and the side walls of which define the width of the channel. The other portion, which forms a cover 21, mates with the channel 20 by conventional means to complete the enclosure and form a rectangular cross section. The shield is not always necessary for operation of the invention, but microstrip lines having substrates of low dielectric constant are conveniently enclosed by such a shield to prevent loss due to radiation of energy from resonating elements. Accordingly, the channel 20 and the cover 21 are included in the interest of completeness.

The disk resonators 14 and 15 have the same resonant frequency $\omega_2$. Transmission lines 22 and 23, which are a first transmission line and a second transmission line, respectively, and which are connected at ends thereof to the second coupler branch line 12 of the directional coupler 13, respectively, are capacitively coupled to the respective disk resonators 14 and 15 at opposite ends 24 and 25 thereof. Transmission lines 26 and 27 also are capacitively coupled at ends 55 and 56 to the disk resonators 14 and 15, respectively. A signal source 57 which produces a second frequency signal $\omega_2$ in a second frequency band is coupled to the transmission line 26 so as to apply the second frequency signal to the first resonator (filter means) 14. A first frequency signal $\omega_1$ in a first frequency band is applied to a coupler input port 29 through a transmission line 28. The second frequency band is separate from the first frequency band. A transmission line 27 is coupled at an end 56 thereof to the second resonator (filter means) 15, and is also connected to a load 58 which is provided to absorb the second frequency signal.

The disk resonators 14 and 15 operate as band pass filters of the center frequency $\omega_2$. These filter means are used for passing a signal of the frequency $\omega_2$ and rejecting a signal of the frequency $\omega_1$. Accordingly the disk resonators can be replaced by any other type of resonators such as ring resonators, and resonators of one-half the wavelength of the transmission line, which resonate at $\omega_2$. Further, the filter means can be replaced by a two or multiple section-resonator band pass filter of frequency $\omega_2$ or a band stop filter of frequency $\omega_1$. Capacitive coupling between each resonator and each transmission line can also be replaced by inductive coupling therebetween. Transmission lines 19 and 28 are connected to the first coupler branch line 11 at a coupler output port 30 and a coupler input port 29, respectively. The first and second transmission lines 22 and 23 which are connected between an end (port) 32 of the second coupler branch line 12 and the disk resonator 14 and between an end (port) 31 of the second coupler branch line 12 and the disk resonator 15, respectively, have the properly selected electrical lengths as mentioned below. By simply varying the electrical lengths, the pass band for the first frequency signal can be easily varied.

The operation of the frequency combining circuit will further be explained with reference to FIGS. 1 and 2, where it is assumed that a signal $S_1$ at a frequency $\omega_1$ is applied via transmission line 28 which is connected to the input port 29 for $S_1$ supply, and a signal $S_2$ at a frequency $\omega_2$ is applied via transmission line 26 from the signal source 57. Accordingly, the four ports of the four-port directional coupler 13 can be designated as follows: coupler input port 29, coupler output port 30, coupler forward coupling port 31, and coupler backward coupling port 32. The electrical length of each of the first and second coupler branch lines 11 and 12 is usually selected to be a quarter of the wavelength of the signal in a selected frequency band. The signal $S_2$ applied via the transmission line 26 passes the first resonator 14, the first transmission line 22, the second coupler branch line 12, the second transmission line 23, the second resonator 15, and the transmission line 27 in order and finally it is absorbed by the matched load 58.

The directional coupler 13 including the first and second coupler branch lines 11 and 12 operates so that a portion of the incident signal $S_1$ applied to the coupler input port 29 is coupled to the coupler forward coupling port 31 when the signal passes to the coupler output port 30, but there is no coupling from the coupler input port 29 to the coupler backward coupling port 32. The quantity of the coupling depends on the coupling factor of the directional coupler. When the signal $S_2$ passes along the second coupler branch line 12 from the coupler backward coupling port 32 toward the coupler forward coupling port 31, a portion of the energy of the signal $S_2$ is coupled to the coupler output port 30, but there is no coupling from the coupler backward coupling port 32 to the coupler input port 29 since the directional coupler 13 has two physically symmetrical planes and the signal coupling phenomena are reciprocal. The signal $S_1$ which passes along the first coupler branch line 11 also appears at the coupler output port 30, and so the coupler output port 30 can be construed to be a combining output port.

FIG. 2 illustrates transmission characteristics for the signal $S_1$ from the coupler input port 29 to the coupler output port 30 versus frequency as the selected frequency band. In FIG. 2, the dotted line shows the transmission loss when the coupling ports 31 and 32 are directly loaded by matched loads. This loss is due to the coupling of the energy of the signal $S_1$ which would be consumed by the loads. The solid curve indicates the practical characteristics of the frequency combining circuit shown in FIG. 1. In FIG. 2 it is assumed that the frequency band A is the desired frequency band for the signal $S_1$ where the transmission should be in the pass band, the frequency band B is the desired frequency band for the signal $S_2$, and the frequency band C is the desired frequency band where it is desired that the transmission be in the stop band. The practical characteristics will be explained in more detail hereinbelow.

Figure 3:
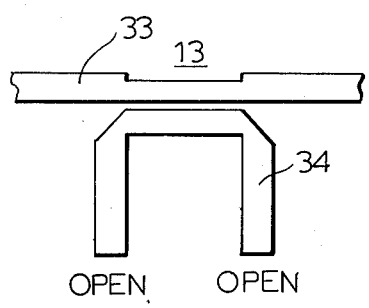
FIG. 3 is an equivalent circuit for explaining the operation of the frequency combining circuit of FIG. 1.

The filter means (resonator), which passes only a signal in the frequency region of $\omega_2$ and rejects signals of other frequencies such as $S_1$, has a matched impedance at frequencies in the $\omega_2$ region and a reactive impedance so that it is open or short-circuited at frequencies outside the $\omega_2$ region. In the case of FIG. 1, the impedance at the end 24 of the first transmission line 22 toward the resonator (filter means) 14 and the impedance of the second transmission line 23 at the end 25 toward the resonator (filter means) 15 are expected to be nearly open-circuited. Therefore, outside the $\omega_2$ region, the frequency combining circuit in FIG. 1, as far as the incident signal (first signal) applied via the transmission line 28 is concerned can be considered to be equivalent to the circuit as shown in FIG. 3 which consists of a transmission line 33 coupled with a transmission line resonator 34. The length of resonator 34 is the total length of the first and second transmission lines 22 and 23 and the second coupler branch line 12. At the frequency when the electrical length of the transmission line resonator 34 is one-half or $n$ times one-half the wavelength of the incident signal (first signal) (where $n$ is integer), the transmission line resonator 34 resonates and the energy at that frequency is trapped. Therefore dips such as 35 and 36 in FIG. 2 are produced in the transmission characteristics.

In the frequency band B, the filter means in FIG. 1 passes signals in the $\omega_2$ region, and consequently the ports 31 and 32 are equivalently loaded by appropriate loads. Therefore, the transmission characteristics thereof coincide with those at the dotted line in FIG. 2. Conveniently, it is a loss band for the first signal. The frequency band outside the frequency band B and the dip regions 35 and 36 is a pass band for the first signal. By varying the lengths of the first and second transmission lines 22 and 23, the pass band in the transmission characteristics is varied. Therefore, by merely adjusting the lengths of the first and second transmission lines 22 and 23, the dip regions can be prevented from existing in the frequency band A. Thereby, the signal $S_1$ (first signal) in the frequency band A passes through the frequency combining circuit without loss and is combined with a portion of the second signal $S_2$ at the coupler output port 30.

Furthermore, by adjusting the lengths of transmission lines 22 and 23, the dip region 35 and the pass band can be made to coincide with the frequency band C and the frequency band A, respectively, simultaneously. This is particularly useful for image recovery in a frequency conversion circuit using the frequency combining circuit where the frequency band C is an image frequency band.

Figure 2A:
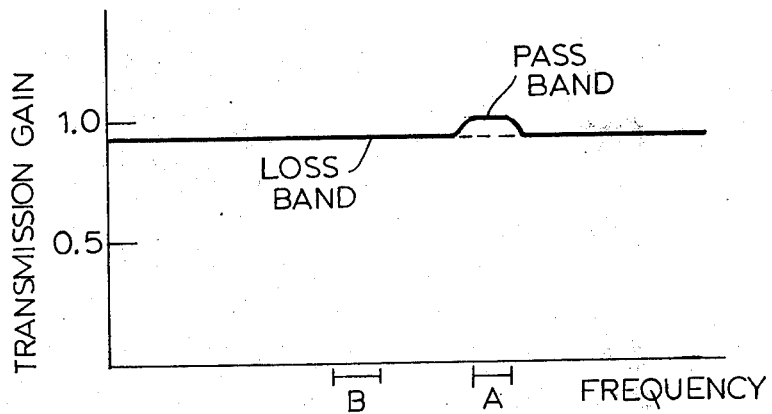
FIG. 2A is a graph similar to that of FIG. 2 obtained by replacing the filter means of FIG. 1 by different kinds of filter means.

When band rejection filters in the $\omega_1$ region are used for the filter means 14 and 15, transmission characteristics become those as shown in FIG. 2A which are a little different from those above described. One example of band rejection filters may have a pattern similar to the one shown in FIG. 2A. In FIG. 2A a dip region will not appear except at the frequency band A, and so the total length of the first and second transmission lines 22 and 23 and the second coupler branch line 12 is required to be so chosen that the dip region does not coincide with the frequency band A. The frequency band outside the frequency band A is all loss band.

Figure 4:
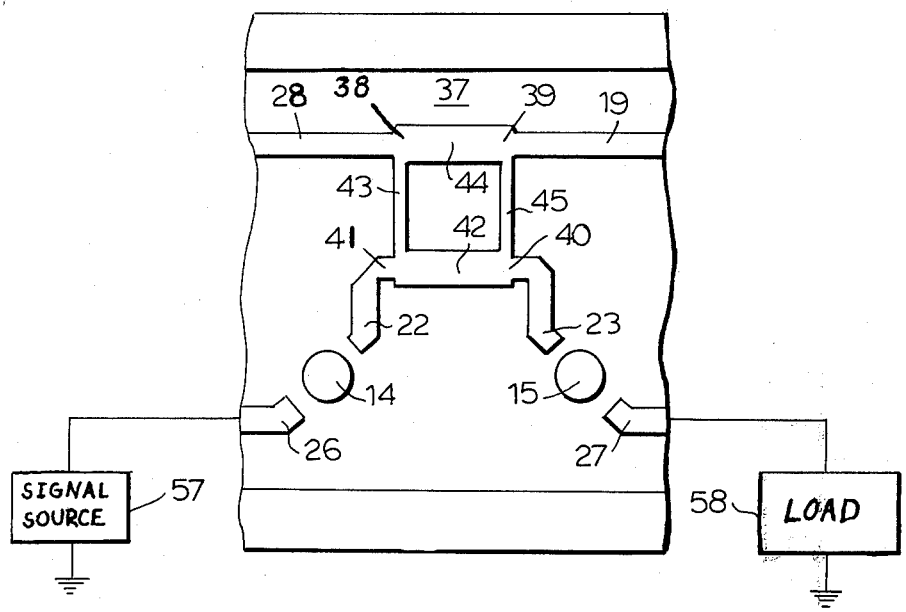
FIG. 4 is a schematic top plan view of another example of a frequency combining circuit in accordance with this invention.

The parallel coupled microstrip directional coupler 13 in FIG. 1 can be replaced by a hybrid branch line directional coupler 37 as illustrated in FIG. 4. Referring to FIG. 4, it is assumed that the first signal $S_1$ at frequency $\omega_1$ is applied via the transmission line 28. The four ports of the four-port directional coupler 37 may be designated in accordance with their operation as follows: coupler input port 38, coupler output port 39, coupler forward coupler port 40, and coupler backward coupling port 41. Accordingly, in this case, it is assumed that the second signal $S_2$ at frequency $\omega_2$ is applied via transmission line 26, and the end of transmission line 27 is loaded with a load 58, since the positions of the coupler forward and backward coupling ports are the reverse of each other in comparison with those in FIG. 1. The first and second filter means (resonators) 14 and 15 operate in the same manner as in the case of FIG. 1. Thus, the second signal $S_2$ passes the first resonator 14, the first transmission line 22, the second coupler branch line 42, the second transmission line 23, the second resonator 15, and the transmission line 27 in this recited order and is absorbed by the load 58 at the end of the transmission line 27.

Figure 5:
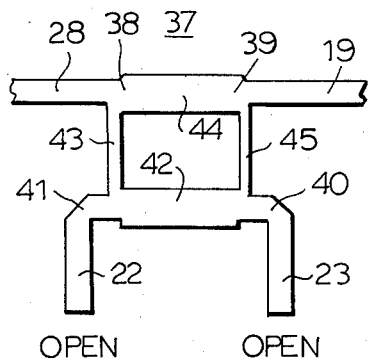
FIG. 5 is an equivalent circuit for explaining the operation of the frequency combining circuit of FIG. 4.

A portion of the energy of the signal $S_2$ is split (i.e., coupled) to the coupler output port 39. At the frequency $\omega_1$ of the first signal $S_1$, the ends of the transmission lines corresponding to ends 24 and 25 of FIG. 1 are nearly open-circuited as described above with reference to FIG. 1, and so the equivalent circuit of the frequency combining circuit for the signal $S_1$ at frequency $\omega_1$ which is separate from the frequency $\omega_2$ is as shown in FIG. 5. In FIG. 5, the electrical length of each of the first and second coupler branch lines 44 and 42 and the other branch lines 43, 45 is selected to be a quarter the wavelength at a desired frequency band. Therefore, if the lengths of the first and second transmission lines 22 and 23 are so chosen that each impedance at the forward and backward coupling ports 40 and 41 is short-circuited, the branch lines 43 and 45 give open-circuited inpedance to the input and output ports 38 and 39, respectively, and so the equivalent circuit becomes more simplified so as to include only the transmission lines 19 and 28 and the first coupler branch line 44. The characteric impedance of the first coupler branch line 44 is nearly the same as that of transmission lines 19 and 28 when the coupling factor is comparatively large such as 10dB. This means that with such a large coupling factor there is no transmission loss for the first signal $S_1$ from the coupler input port 38 to the coupler output port 39, which is a combining output port.

Figure 6:
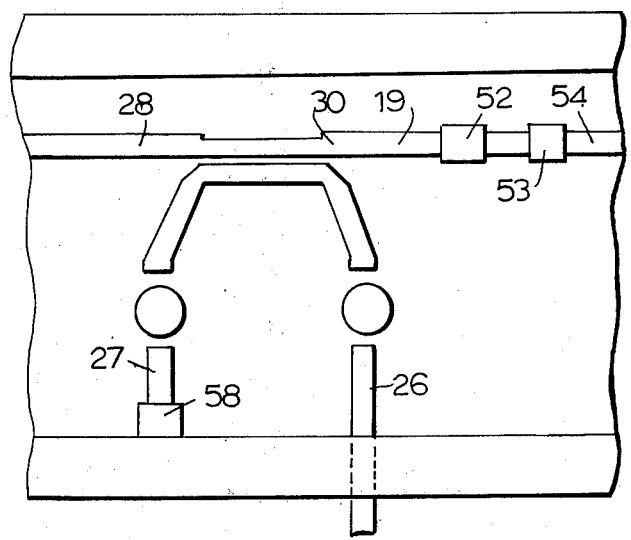
FIG. 6 is a schematic top plan view of a frequency converter circuit utilizing the frequency combining circuit of FIG. 1.

FIG. 6 illustrates a frequency conversion circuit using a frequency combining circuit shown in FIG. 1 where it is assumed that an RF signal is applied via the transmission line 28, and a pump signal is applied via the transmission line 26. The output end of transmission line 27 is loaded by no-reflection-load 58 such as a thin film resistor. The RF signal and a portion of the pump signal are combined at the coupler output port 30 and the combined signal is applied via the transmission line 19 to a mixer element (mixing diode) 52, a filter 53, and an output transmission line 54. As the combined signal includes the RF signal and the pump signal, this combination is heterodyned in the mixer 52 which may be a Schottky barrier diode if the circuit is used for down conversion. The output signal (product) of the mixer 52 is applied to a filter 53 which can be a conventional low pass filter such as a lumped element filter, which passes the IF output frequency to the output transmission line 54. Due to the frequency selectivity of the dip frequency region with regard to the RF signal (as apparent from the above description with reference to FIGS. 1 and 2), both a single sideband signal and a double sideband signal can be applied to the mixer 52, so that the frequency conversion circuit can have the downconversion characteristics of both the single sideband and the double sideband. Of course, since the frequency combining circuit operates reciprocally, upconversion may also be achieved by utilizing another appropriate mixing device as the mixer instead of the Schottky barrier diode. For instance, a nonlinear resistive diode or a nonlinear capacitor, such as a varactor diode, may be used therefor. In this case, the pump signal source is coupled to the transmission line 19. It would then be heterodyned (or parametrically amplified if a varactor diode is used) in the mixer 52 with the IF input signal from the line 54 to produce a double sideband product signal at the transmission line 19. Either a single sideband or double sideband product signal is taken out by the transmission line 28.

As is apparent from the foregoing description, in the frequency combining circuit of this invention, a prototype four-port directional coupler is used which has a coupler input port, a coupler output port, a coupler forward coupling port, and a coupler backward coupling port. A first frequency signal such as an RF signal in a first frequency band is applied to the coupler input port and is passed to the coupler output port. A first filter which rejects the first frequency signal and passes a second frequency signal such as a pump signal in a frequency band separate from the first frequency band is connected to the coupler backward coupling port, the opposite end of the filter being an input port for the second frequency signal. A second filter which operates in the same manner as the first filter is connected to the coupler forward coupling port, the opposite end of the second filter being an output port for the second frequency signal and is loaded by a matched load which absorbs the second frequency signal. A portion of the energy of the second frequency signal is coupled to the coupler output port, that is, it is combined with the first frequency signal at that port. Each of the filters is spaced at an appropriate distance from the coupler forward and backward coupling ports by a transmission line so that the loss for the first frequency signal will be very small. The directional coupler with the two filters operates as a three-port device when the output of the second frequency signal is provided with a load and is particularly well-suited for frequency conversion application with low conversion loss and good isolation. Further, by properly selecting the lengths of the first and the second transmission lines, any frequency signal outside both the first and second frequency bands and applied to the coupler input port for the first frequency signal can be prevented from appearing at the coupler output port.

What is claimed is:

1. A frequency combining circuit in the form of a planar transmission circuit and operative in a selected frequency band, said frequency combining circuit comprising:

a four-port directional coupler having a coupler input port for receiving a first frequency signal in a first frequency band, a first coupler branch line coupled to said coupler input port, a coupler output port coupled to said first coupler branch line for receiving said first frequency signal from said coupler input port through said first coupler branch line, a coupler forward coupling port coupled to said first coupler branch line for receiving a portion of said first frequency signal, a second coupler branch line coupled to said coupler forward coupling port, and a coupler backward coupling port coupled to said second coupler branch line and also coupled to said first branch line;

a first transmission line coupled at one end thereof to said coupler backward coupling port;

first filter means coupled to the other end of said first transmission line for receiving a second frequency signal from a signal source, said second frequency signal being in a second frequency band separated from said first frequency band, said first filter means having a filtering property for rejecting said first frequency signal and passing therethrough said second frequency signal to said first transmission line and hence to said coupler backward coupling port, a portion of said second frequency signal being transferred to said coupler output port, and the other portion of said second frequency signal being transferred to said coupler forward coupling port through said second coupler branch line;

a second transmission line coupled at one end thereof to said coupler forward coupling port for passing therethrough to the other end thereof said portion of said first frequency signal from said coupler forward coupling port;

second filter means coupled to said other end of said second transmission line and having a filtering property for rejecting said first frequency signal and passing therethrough said second frequency signal; and a load to which said second filter means is also coupled, said portion of said first frequency signal passed through said coupler forward coupling port and said second transmission line being rejected by said second filter means and being returned to said coupler forward coupling port through said second transmission line, and said other portion of said second frequency signal passed through said second coupler branch line, said coupler forward coupling port and said second transmission line being passed through said second filter means and being absorbed by said load, and the pass band of said frequency combining circuit for said first frequency signal being varied by varying the length of said first transmission line and the length of said second transmission line.

2. A frequency combining circuit as claimed in claim 1 wherein said coupler branch lines of said directional coupler are a parallel coupled microstrip line pair.

3. A frequency combining circuit as claimed in claim 2 wherein said first and second transmission lines have lengths for preventing a frequency signal outside both said first and second frequency bands and applied to said coupler input port for the first frequency signal from appearing at said coupler output port.

4. A frequency combining circuit as claimed in claim 1 wherein said coupler branch lines of said directional coupler are hybrid branch lines.

5. A frequency combining circuit as claimed in claim 4 wherein said first and second transmission lines have lengths for preventing a frequency signal outside both said first and second frequency bands and applied to said coupler input port for the first frequency signal from appearing at said coupler output port.

* * * * *